US011258458B2

(12) United States Patent
Lasserre et al.

(10) Patent No.: US 11,258,458 B2
(45) Date of Patent: Feb. 22, 2022

(54) METHODS AND DEVICES FOR LOSSY CODING OF POINT CLOUD OCCUPANCY

(71) Applicant: BlackBerry Limited, Waterloo (CA)

(72) Inventors: Sébastien Lasserre, Thorigné-Fouillard (FR); David Flynn, Darmstadt (DE)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 17/258,839

(22) PCT Filed: Jul. 8, 2019

(86) PCT No.: PCT/CA2019/050938
§ 371 (c)(1),
(2) Date: Jan. 8, 2021

(87) PCT Pub. No.: WO2020/010445
PCT Pub. Date: Jan. 16, 2020

(65) Prior Publication Data
US 2021/0273648 A1 Sep. 2, 2021

(30) Foreign Application Priority Data
Jul. 10, 2018 (EP) .................................... 18305925

(51) Int. Cl.
*H03M 7/30* (2006.01)
*H03M 7/40* (2006.01)

(52) U.S. Cl.
CPC ....... *H03M 7/3059* (2013.01); *H03M 7/3079* (2013.01); *H03M 7/4006* (2013.01); *H03M 7/70* (2013.01)

(58) Field of Classification Search
CPC ............. H03M 7/3059; H03M 7/3079; H03M 7/4006; H03M 7/70; H03M 7/3066
See application file for complete search history.

(56) References Cited

U.S. PATENT DOCUMENTS

| 10,587,286 B1* | 3/2020 | Flynn .................... H04N 19/91 |
| 10,693,492 B1* | 6/2020 | Lasserre ............. H03M 7/6011 |
| 11,051,024 B1* | 6/2021 | Lasserre ............. H04N 19/567 |
| 11,138,762 B2* | 10/2021 | Sinharoy ............. H03M 7/3059 |
| 2003/0214502 A1 | 11/2003 | Park et al. |
| 2017/0347100 A1* | 11/2017 | Chou ................. H03M 7/3066 |

(Continued)

FOREIGN PATENT DOCUMENTS

WO 2019079397 A1 4/2019

OTHER PUBLICATIONS

WIPO: International Search Report and Written Opinion, relating to PCT application No. PCT/CA2019/050938, dated Sep. 5, 2019.
(Continued)

Primary Examiner — Lam T Mai
(74) Attorney, Agent, or Firm — Rowand LLP

(57) ABSTRACT

Methods and devices for lossy encoding of point clouds. Rate-distortion optimization is used in coding an occupancy pattern for a sub-volume to determine whether to invert any of the bits of the occupancy pattern. The assessment may be a greedy evaluation of whether to invert bits in the coding order. Inverting a bit of the occupancy pattern amounts to adding or removing a point from the point cloud. A distortion metric may measure distance between the point added or removed and its nearest neighbouring point.

25 Claims, 9 Drawing Sheets

(56) References Cited

U.S. PATENT DOCUMENTS

| | | | | |
|---|---|---|---|---|
| 2019/0087979 | A1* | 3/2019 | Mammou | G06T 9/001 |
| 2020/0020132 | A1* | 1/2020 | Sinharoy | H03M 7/3059 |
| 2020/0153885 | A1* | 5/2020 | Lee | G06T 9/001 |
| 2020/0302651 | A1* | 9/2020 | Flynn | G06T 3/4084 |
| 2020/0396489 | A1* | 12/2020 | Flynn | H03M 7/405 |
| 2020/0413080 | A1* | 12/2020 | Lasserre | H04N 19/46 |
| 2021/0144403 | A1* | 5/2021 | Lasserre | G06T 9/004 |
| 2021/0167795 | A1* | 6/2021 | Lasserre | H03M 7/30 |
| 2021/0192797 | A1* | 6/2021 | Lasserre | G06T 9/001 |
| 2021/0203989 | A1* | 7/2021 | Wang | G06T 9/00 |
| 2021/0209812 | A1* | 7/2021 | Han | H04N 19/1883 |
| 2021/0272324 | A1* | 9/2021 | Lasserre | G06T 9/40 |
| 2021/0281874 | A1* | 9/2021 | Lasserre | H03M 7/30 |

OTHER PUBLICATIONS

Oliveria et al.: "Graph-Based Static 3D Clouds Geometry Coding", IEEE Transactions on Multimedia; vol. 21 pp. 284-299 ISSN: 1520-9210, 1941-0077; DOI: 10.1109/TMM.2018.2859591, dated Feb. 2019.

EPO: Extended European Search Report relating to EP application No. 18305925.2, dated Jan. 23, 2019.

Hornung et al.: "OctoMap: an efficient probabilistic 3D mapping framework based on octrees", Autonomous Robots, vol. 34, No. 3, pp. 189-206, XP055147395, dated Feb. 7, 2013.

Sullivan et al.: "Rate-Distortion Optimization for Video Compression", IEEE Signal Processing Magazine, IEEE Service Center, Piscataway, NJ, US, vol. 15, No. 6, pp. 74-90, XP011089821, dated Nov. 1, 1998.

EPO: EP Examination Report relating to EP application No. 18305925.2, dated Nov. 10, 2020.

Yiting et al:. "Attribute compression of 3D point clouds using Laplacian sparsity optimized graph transform", 2017 IEEE Visual Communications and Image Processing (VCIP), IEEE, pp. 1-4, XP033325809, dated Dec. 10, 2017.

Krivokua et al.: "A Volumetric Approach to Point Cloud Compression" 8I Technical Report, XP055652630, dated Jan. 1, 2018.

Anonymous: "Rate-distortion optimization—Wikipedia", XP055746955, dated Jul. 15, 2017.

* cited by examiner $$H(b_0, b_1, b_2, \ldots b_7 | N)$$

$$H(b_0 | N)\ H(b_1 | N, b_0)\ H(b_2 | N, b_0 b_1) \ldots H(b_7 | N, b_0 b_1 b_2 \ldots b_6)$$

METHODS AND DEVICES FOR LOSSY CODING OF POINT CLOUD OCCUPANCY

FIELD

The present application generally relates to point cloud compression and, in particular to methods and devices for lossy coding of point clouds and, specifically, the occupancy data defining the location of points in the point cloud.

BACKGROUND

Data compression is used in communications and computer networking to store, transmit, and reproduce information efficiently. There is an increasing interest in representations of three-dimensional objects or spaces, which can involve large datasets and for which efficient and effective compression would be highly useful and valued. In some cases, three-dimensional objects or spaces may be represented using a point cloud, which is a set of points each having a three coordinate location (X, Y, Z) and, in some cases, other attributes like colour data (e.g. luminance and chrominance), transparency, reflectance, normal vector, etc. Point clouds can be static (a stationary object or a snapshot of an environment/object at a single point in time) or dynamic (a time-ordered sequence of point clouds).

Example applications for point clouds include topography and mapping applications. Autonomous vehicle and other machine-vision applications may rely on point cloud sensor data in the form of 3D scans of an environment, such as from a LiDAR scanner. Virtual reality simulations may rely on point clouds.

It will be appreciated that point clouds can involve large quantities of data and compressing (encoding and decoding) that data quickly and accurately is of significant interest. Accordingly, it would be advantageous to provide for methods and devices that more efficiently and/or effectively compress data for point clouds.

Occupancy data is typically coded using a tree-based coding structure, where occupancy of nodes and leaves of the tree is signaled using an occupancy bit for each node indicating whether it contains at least one point or not. The nodes correspond to sub-volumes in a recursively divided space in which the point cloud is located. The coding of the occupancy bits is lossless.

It would be advantageous to obtain methods and devices that better compress point cloud data, so that it can be transmitted and/or stored more efficiently.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
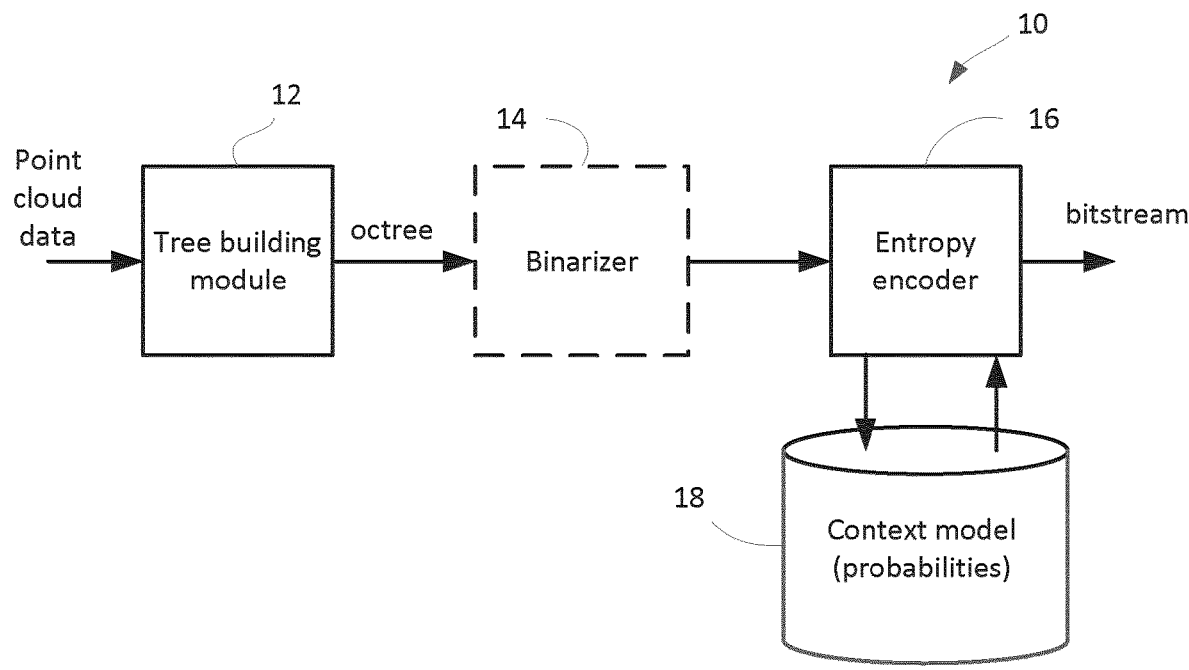
FIG. 1 shows a simplified block diagram of an example point cloud encoder.

The present application describes methods of encoding and encoders for encoding point clouds.

In one aspect, the present application describes a method of lossy encoding a point cloud to generate a bitstream of compressed point cloud data representing the three-dimensional location of a physical object. The point cloud is located within a volumetric space recursively split into sub-volumes and containing the points of the point cloud, each of the points having a geometric location within the volumetric space. An occupancy bit associated with each respective sub-volume indicates whether that respective sub-volume contains at least one of the points. The recursive splitting occurs to a maximum depth. The method includes, for an occupied sub-volume at a depth one level above the maximum depth, determining a rate-distortion cost of inverting at least one of the occupancy bits associated with child sub-volumes of the occupied sub-volume, wherein determining the rate-distortion cost includes determining a change in bitrate attributable to inverting the at least one of the occupancy bits. The method further includes, if the rate-distortion cost is negative, then inverting the at least one of the occupancy bits, and, if the rate distortion cost is not negative, then not inverting the at least one of the occupancy bits; and entropy encoding the occupancy bits associated with the child sub-volumes to output a bitstream of compressed encoded point cloud data.

In some implementations, inverting the at least one of the occupancy bits may include adding a point to the point cloud if one of the occupancy bits is inverted from a 0 to a 1, and may include removing a point from the point cloud if one of the occupancy bits is inverted from a 1 to a 0.

In some implementations, determining the rate-distortion cost may include determining the rate-distortion cost for each occupancy bit in turn, and, for each occupancy bit, if the rate-distortion cost of inverting that occupancy bit is negative then inverting that occupancy bit. In some such cases, the determining the rate-distortion cost for each occupancy bit in turn occurs in a coding order within the occupied sub-volume.

In some implementations, determining the rate-distortion cost may include determining the rate-distortion cost of all possible sequences of the occupancy bits to identify a least cost sequence, and wherein entropy encoding includes entropy encoding the least cost sequence.

In some implementations, determining the rate-distortion cost may include determining a distortion metric quantifying distortion attributable to inverting the at least one of the occupancy bits. In some such cases, the distortion metric may include determining a distance between a point represented by the occupancy bit and a nearest point in the point cloud. In some examples, the nearest point may be a point in one of the child sub-volumes within the occupied sub-volume, or within a child sub-volume in a neighbouring sub-volume adjacent to the occupied sub-volume.

In some implementations, the distortion metric may be $D(A,B)=d(A,B)+d(B,A)$, in which A is a set representing the points of the point cloud and B is a set representing the points of the point cloud after inverting the at least one of the associated occupancy bits, and wherein d( ) is a measure of distance.

Some implementations of the method may include first determining that the occupied sub-volume is at the depth one level above the maximum depth a tree-based structure.

Entropy encoding may include context-adaptive arithmetic coding.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

Other aspects and features of the present application will be understood by those of ordinary skill in the art from a review of the following description of examples in conjunction with the accompanying figures.

Any feature described in relation to one aspect or embodiment of the invention may also be used in respect of one or more other aspects/embodiments. These and other aspects of the present invention will be apparent from, and elucidated with reference to, the embodiments described herein.

At times in the description below, the terms "node", "volume" and "sub-volume" may be used interchangeably. It will be appreciated that a node is associated with a volume or sub-volume. The node is a particular point on the tree that may be an internal node or a leaf node. The volume or sub-volume is the bounded physical space that the node represents. The term "volume" may, in some cases, be used to refer to the largest bounded space defined for containing the point cloud. A volume may be recursively divided into sub-volumes for the purpose of building out a tree-structure of interconnected nodes for coding the point cloud data.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality systems, to give some examples. Dynamic point cloud data for applications like machine vision can be quite different from static point cloud data like that for conservation purposes. Automotive vision, for example, typically involves relatively small resolution, non-coloured, highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point cloud data is useful, a lack of effective and efficient compression, i.e. encoding and decoding processes, may hamper adoption and deployment. A particular challenge in coding point clouds that does not arise in the case of other data compression, like audio or video, is the coding of the geometry of the point cloud. Point clouds tend to be sparsely populated, which makes efficiently coding the location of the points that much more challenging.

One of the more common mechanisms for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

A commonly-used tree structure is an octree. In this structure, the volumes/sub-volumes are all cubes and each split of a sub-volume results in eight further sub-volumes/sub-cubes. Another commonly-used tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. Both these examples relate to cubes or rectangular cuboids; however, the present application is not restricted to such tree structures and the volumes and sub-volumes may have other shapes in some applications. The partitioning of a volume is not necessarily into two sub-volumes (KD-tree) or eight sub-volumes (octree), but could involve other partitions, including division into non-rectangular shapes or involving non-adjacent sub-volumes.

The present application may refer to octrees for ease of explanation and because they are a popular candidate tree structure for automotive applications, but it will be understood that the methods and devices described herein may be implemented using other tree structures.

Reference is now made to FIG. 1, which shows a simplified block diagram of a point cloud encoder 10 in accordance with aspects of the present application. The point cloud encoder 10 includes a tree building module 12 for receiving point cloud data and producing a tree (in this example, an octree) representing the geometry of the volumetric space containing point cloud and indicating the location or position of points from the point cloud in that geometry.

The basic process for creating an octree to code a point cloud may include:
1. Start with a bounding volume (cube) containing the point cloud in a coordinate system
2. Split the volume into 8 sub-volumes (eight sub-cubes)
3. For each sub-volume, mark the sub-volume with 0 if the sub-volume is empty, or with 1 if there is at least one point in it
4. For all sub-volumes marked with 1, repeat (2) to split those sub-volumes, until a maximum depth of splitting is reached
5. For all leaf sub-volumes (sub-cubes) of maximum depth, mark the leaf cube with 1 if it is non-empty, 0 otherwise The above process might be described as an occupancy-equals-splitting process, where occupancy implies splitting, with the constraint that there is a maximum depth or resolution beyond which no further splitting will occur. In this case, a single flag signals whether a node is split and hence whether it is occupied by at least one point, and vice versa. At the maximum depth, the flag signals occupancy, with no further splitting possible.

In some implementations, splitting and occupancy are partially independent such that a node may be occupied and may or may not be split. There are two variations of this implementation:
1. Split-then-occupied. A signal flag indicates whether a node is split. If split, then the node must contain a point—that is splitting implies occupancy. Otherwise, if the node is not to be split then a further occupancy flag signals whether the node contains at least one point. Accordingly, when a node is not further split, i.e. it is a leaf node, the leaf node must have an associated occupancy flag to indicate whether it contains any points.
2. Occupied-then-split. A single flag indicates whether the node is occupied. If not occupied, then no splitting occurs. If it is occupied, then a splitting flag is coded to indicate whether the node is further split or not.

Irrespective of which of the above-described processes is used to build the tree, it may be traversed in a pre-defined order (breadth-first or depth-first, and in accordance with a scan pattern/order within each divided sub-volume) to produce a sequence of bits from the flags (occupancy and/or splitting flags). This may be termed the serialization or binarization of the tree. As shown in FIG. 1, in this example, the point cloud encoder 10 includes a binarizer 14 for binarizing the octree to produce a bitstream of binarized data representing the tree.

This sequence of bits may then be encoded using an entropy encoder 16 to produce a compressed bitstream. The entropy encoder 16 may encode the sequence of bits using a context model 18 that specifies probabilities for coding bits based on a context determination by the entropy encoder 16. The context model 18 may be adaptively updated after coding of each bit or defined set of bits. The entropy encoder 16 may, in some cases, be a binary arithmetic encoder. The binary arithmetic encoder may, in some implementations, employ context-adaptive binary arithmetic coding (CABAC). In some implementations, coders other than arithmetic coders may be used.

In some cases, the entropy encoder 16 may not be a binary coder, but instead may operate on non-binary data. The output octree data from the tree building module 12 may not be evaluated in binary form but instead may be encoded as non-binary data. For example, in the case of an octree, the eight flags within a sub-volume (e.g. occupancy flags) in their scan order may be considered a $2^8-1$ bit number (e.g. an integer having a value between 1 and 255 since the value 0 is not possible for a split sub-volume, i.e. it would not have been split if it was entirely unoccupied). This number may be encoded by the entropy encoder using a multi-symbol arithmetic coder in some implementations. Within a sub-volume, e.g. a cube, the sequence of flags that defines this integer may be termed a "pattern".

Like with video or image coding, point cloud coding can include predictive operations in which efforts are made to predict the location of points in a volume. From the predicted locations of points, one can predict the occupancy pattern for a sub-volume. Predictions may be spatial (dependent on previously coded sub-volumes in the same point cloud) or temporal (dependent on previously coded point clouds in a time-ordered sequence of point clouds).

Figure 2:
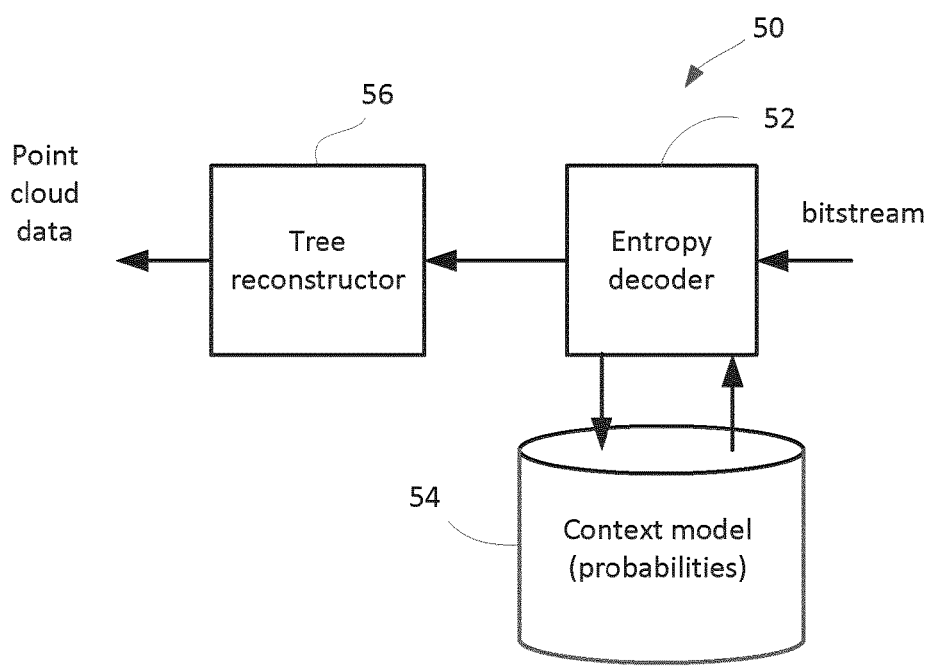
FIG. 2 shows a simplified block diagram of an example point cloud decoder.

A block diagram of an example point cloud decoder 50 that corresponds to the encoder 10 is shown in FIG. 2. The point cloud decoder 50 includes an entropy decoder 52 using the same context model 54 used by the encoder 10. The entropy decoder 52 receives the input bitstream of compressed data and entropy decodes the data to produce an output sequence of decompressed bits. The sequence is then converted into reconstructed point cloud data by a tree reconstructor 56. The tree reconstructor 56 rebuilds the tree structure from the decompressed data and knowledge of the scanning order in which the tree data was binarized. The tree reconstructor 56 is thus able to reconstruct the location of the points from the point cloud (subject to the resolution of the tree coding).

Figure 3:
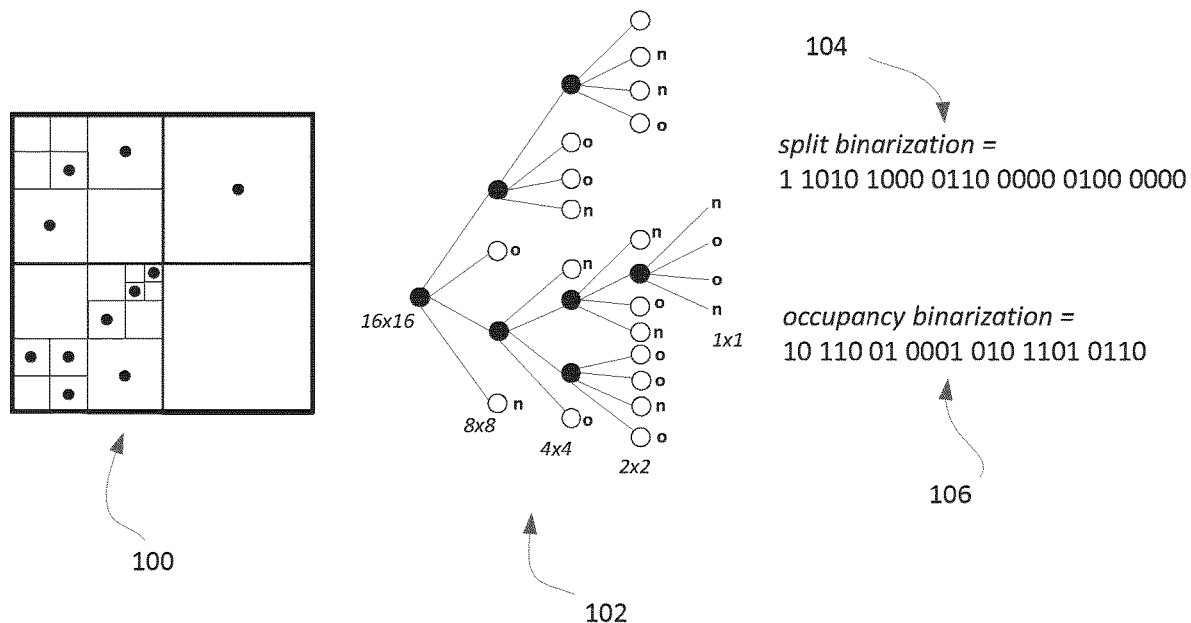
FIG. 3 shows an example partial sub-volume and associated tree structure for coding.

An example partial sub-volume 100 is shown in FIG. 3. In this example, a sub-volume 100 is shown in two-dimensions for ease of illustration, and the size of the sub-volume 100 is 16×16. It will be noted that the sub-volume has been divided into four 8×8 sub-squares, and two of those have been further subdivided into 4×4 sub-squares, three of which are further divided to 2×2 sub-squares, and one of the 2×2 sub-square is then divided into 1×1 squares. The 1×1 squares are the maximum depth of the tree and represent the finest resolution for positional point data. The points from the point cloud are shown as dots in the figure.

The structure of the tree 102 is shown to the right of the sub-volume 100. The sequence of splitting flags 104 and the corresponding sequence of occupancy flags 106, obtained in a pre-defined breadth-first scan order, is shown to the right of the tree 102. It will be observed that in this illustrative example, there is an occupancy flag for each sub-volume (node) that is not split, i.e. that has an associated splitting flag set to zero. These sequences may be entropy encoded. This is an example of a "split-then-occupied" type of tree.

Figure 4:
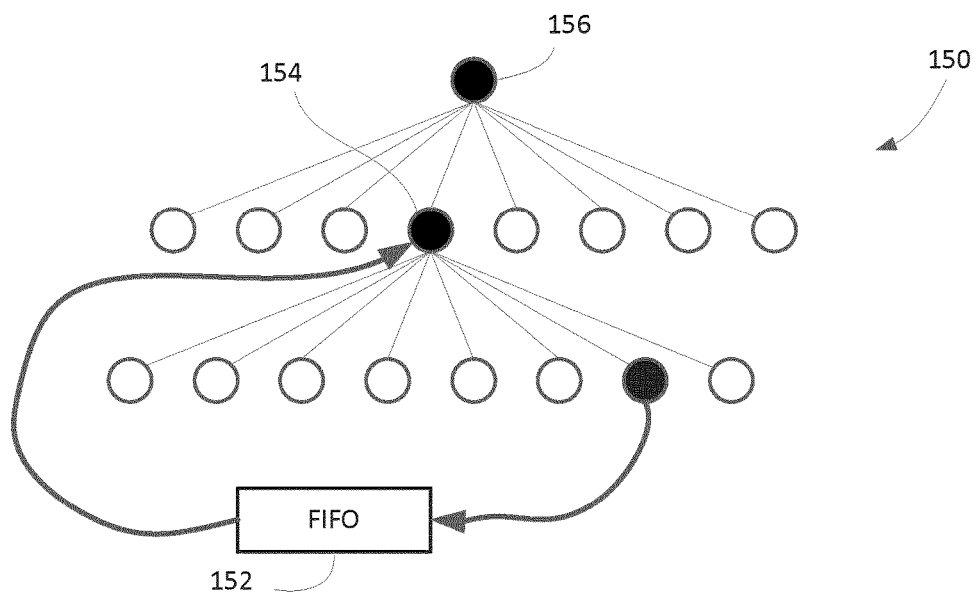
FIG. 4 illustrates the recursive splitting and coding of an octree.

Another example, which employs an occupied =splitting condition, is shown in FIG. 4. FIG. 4 illustrates the recursive splitting and coding of an octree 150. Only a portion of the octree 150 is shown in the figure. A FIFO 152 is shown as processing the nodes for splitting to illustrate the breadth-first nature of the present process. The FIFO 152 outputs an occupied node 154 that was queued in the FIFO 152 for further splitting after processing of its parent node 156. The tree builder splits the sub-volume associated with the occupied node 154 into eight sub-volumes (cubes) and determines their occupancy. The occupancy may be indicated by an occupancy flag for each sub-volume. In a prescribed scan order, the flags may be referred to as the occupancy pattern for the node 154. The pattern may be specified by the integer representing the sequence of occupancy flags associated with the sub-volumes in the pre-defined scan order. In the case of an octree, the pattern is an integer in the range [1, 255].

The entropy encoder then encodes that pattern using a non-binary arithmetic encoder based on probabilities specified by the context model. In this example, the probabilities may be a pattern distribution based on an initial distribution model and adaptively updated. In one implementation, the pattern distribution is effectively a counter of the number of times each pattern (integer from 1 to 255) has been encountered during coding. The pattern distribution may be updated after each sub-volume is coded. The pattern distribution may be normalized, as needed, since the relative frequency of the patterns is germane to the probability assessment and not the absolute count.

Based on the pattern, those child nodes that are occupied (e.g. have a flag=1) are then pushed into the FIFO 152 for further splitting in turn (provided the nodes are not a maximum depth of the tree).

Figure 5:
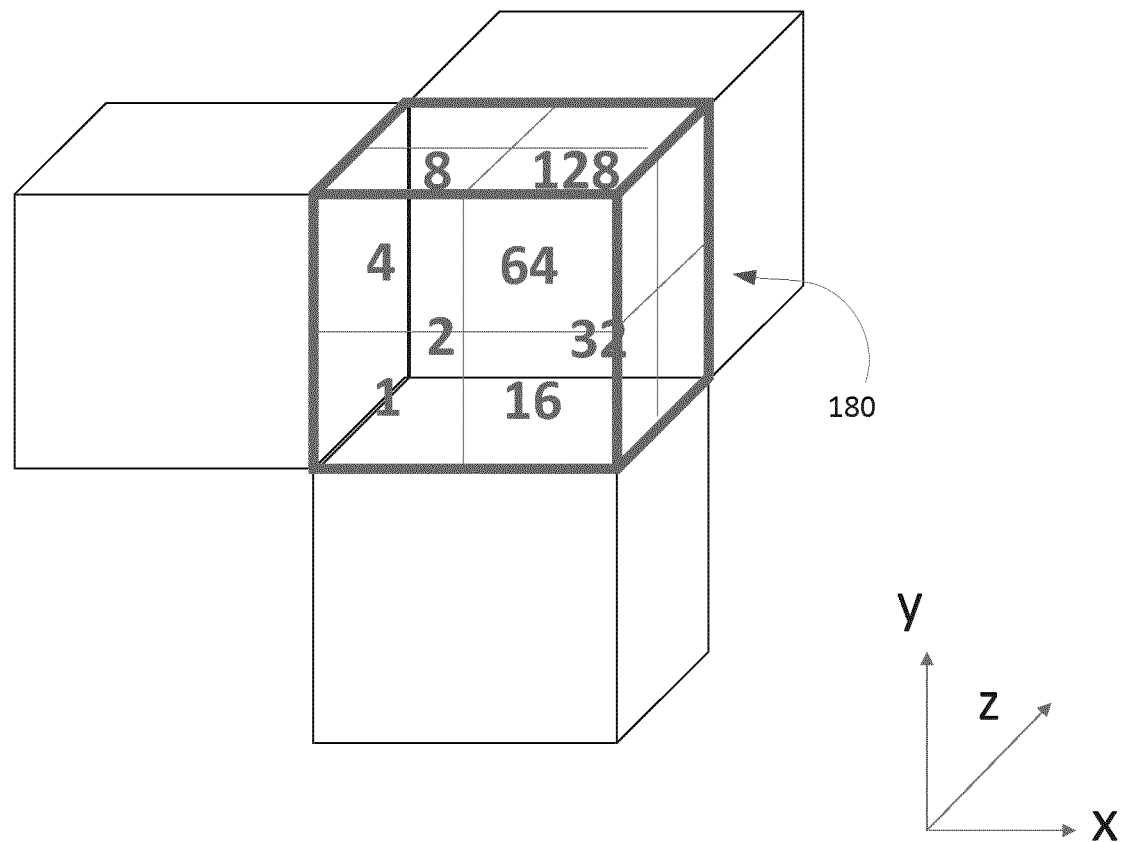
FIG. 5 shows an example scan pattern within an example cube from an octree.

Reference is now made to FIG. 5, which shows an example cube 180 from an octree. The cube 180 is subdivided into eight sub-cubes. The scan order for reading the flags results in an eight bit string, which can be read as an integer [1, 255] in binary. Based on the scan order and the resulting bit position of each sub-cube's flag in the string, the sub-cubes have the values shown in FIG. 5. The scan order may be any sequence of the sub-cubes, provided both the encoder and decoder use the same scan order.

Figure 6:
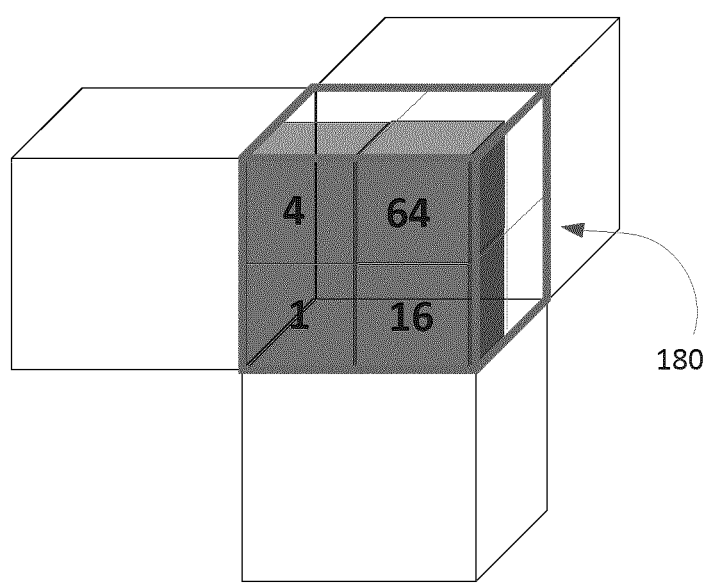
FIG. 6 shows an example occupancy pattern within an example cube.

As an example, FIG. 6 shows the cube 180 in which the four "front" sub-cubes are occupied. This would correspond to pattern 85, on the basis that the sub-cubes occupied are cubes 1+4+16+64. The integer pattern number specifies the pattern of occupancy in the sub-cubes.

In European patent application no. 18305037.6, the present applicants described methods and devices for selecting among available pattern distributions to be used in coding a particular node's pattern of occupancy based on some occupancy information from previously-coded nodes near the particular node. In one example implementation, the occupancy information is obtained from the pattern of occupancy of the parent to the particular node. In another example implementation, the occupancy information is obtained from one or more nodes neighbouring the particular node. The contents of European patent application no. 18305037.6 are incorporated herein by reference. This is referred to as determining a "neighbour configuration", and selecting a context (i.e. a pattern distribution) at least partly based on the neighbour configuration.

Figure 7:
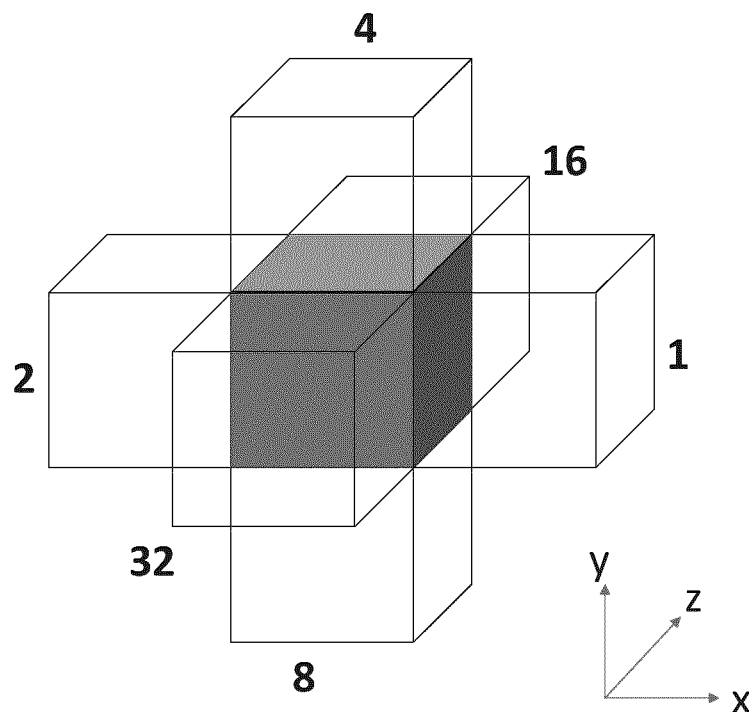
FIG. 7 shows an example of neighbouring sub-volumes.

FIG. 7 illustrates a set of neighbors surrounding a current node, where neighbour is defined as nodes sharing a face. In this example, the nodes/sub-volumes are cubes and the cube at the center of the image has six neighbours, one for each face. In an octree, it will be appreciated that neighbours to the current node will include three sibling nodes, i.e. nodes that have the same parent node. It will also include three nodes that do not have the same parent node. Accordingly, occupancy data for some of the neighboring nodes will be available because they are siblings, but occupancy data for some neighbouring nodes may or may not be available, depending on whether those nodes were previously coded. Special handling may be applied to deal with missing neighbours. In some implementations, the missing neighbour may be presumed to be occupied or may be presumed to be unoccupied. It will be appreciated that the neighbour definition may be broadened to include neighbouring nodes based on a shared edge or based on a shared vertex to include additional adjacent sub-volumes in the assessment.

Figure 8:
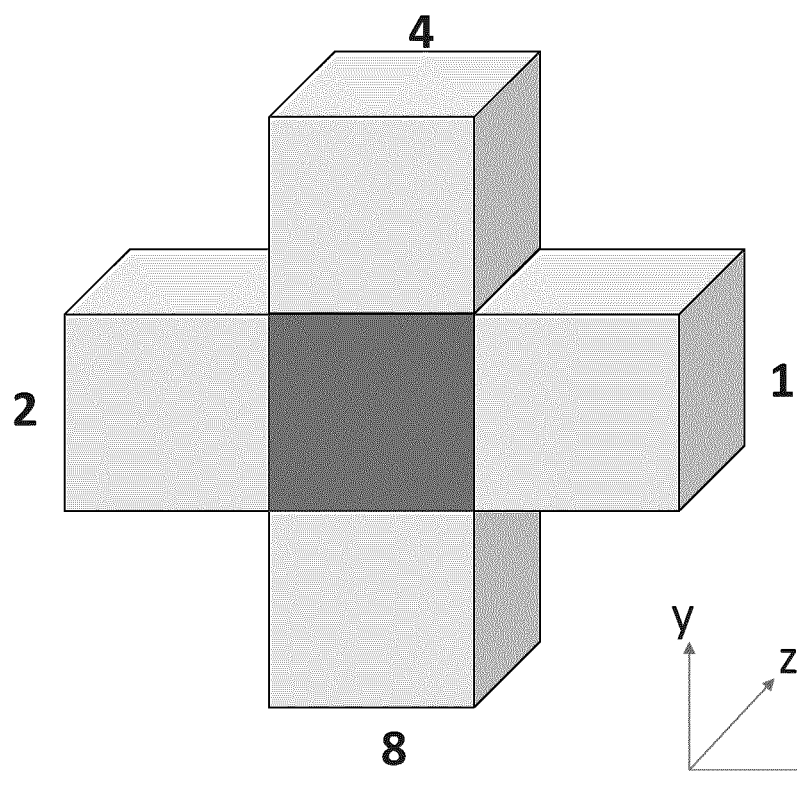
FIG. 8 shows an example neighbour configuration showing occupancy among neighbouring nodes.

The occupancy of the neighbours may be read in a scan order that effectively assigns a value to each neighbour, much like as is described above with respect to occupancy patterns. As illustrated, the neighbouring nodes effectively take values of 1, 2, 4, 8, 16 or 32, and there are therefore 64 (0 to 63) possible neighbour occupancy configurations. This value may be termed the "neighbour configuration" herein. As an example, FIG. 8 illustrates an example of neighbour configuration 15, in which neighbours 1, 2, 4 and 8 are occupied and neighbours 16 and 32 are empty.

In some cases, the number of probability distributions may equal the number of possible occupancy outcomes in the selection criteria. In other words, in the case of a parent pattern for an octree, there would be probability distributions involving 255 probabilities each. In the case of neighbour configuration, if neighbour is defined as sharing a face, there would be 64 probability distributions. However, it will be understood that too many distributions may result in slow adaptation due to scarcity of data, i.e. context dilution. Accordingly, in some embodiments, similar patterns may be grouped so as to use the same probability distribution. For example separate distributions may be used for patterns corresponding to fully occupied, vertically-oriented, horizontally-oriented, mostly empty, and then all other cases. This could reduce the number of probability distributions to about five. It will be appreciated that different groupings of patterns could be formed to result in a different number of probability distributions.

In one variation to the neighbour-based probability distribution selection, the number of distributions may be reduced by exploiting the symmetry of the neighbourhood. By permuting the neighbour configuration or permuting the pattern distribution, structurally similar configurations having a line of symmetry can re-use the same distribution. As a result, the number of neighbour configurations (and thus distribution patterns), may be reduced. In some cases, the 64 neighbour configurations can be reduced using these techniques to 64, 24, 18 or 10 total neighbour configurations. In other words, neighbour configurations that can use the same pattern distribution may be grouped into a class. A class containing more than one neighbour configuration may be referred to herein as a "neighbour configuration" in that one of the neighbour configurations effectively subsumes other neighbour configurations by way of reflection or permutation of those other configurations.

The above-described techniques of using neighbour occupancy information for coding tree occupancy focus on using non-binary entropy coding of the occupancy pattern, where a pattern distribution is selected based on neighbour occupancy information, i.e. neighbour configuration. However, in some instances, the use of binary coders can be more efficient in terms of hardware implementation. Moreover, on-the-fly updates to many probabilities may require fast-access memory and computation within the heart of the arithmetic coder. Accordingly, it may be advantageous to find methods and devices for entropy encoding the occupancy pattern using binary arithmetic coders. It would be advantageous to use binary coders if it can be done without significantly degrading compression performance and while guarding against having an overwhelming number of contexts to track.

The use of binary coders in place of a non-binary coder is reflected in the entropy formula:

$$H(X_1, X_2|Y) = H(X_1|Y)H(X_2|Y,X_1)$$

where $X=(X_1, X_2)$ is the non-binary information to be coded, and Y is the context for coding, i.e. the neighbour configuration or selected pattern distribution. To convert non-binary coding of X into binary coding, the information $(X_1, X_2)$ is split into information $X_1$ and $X_2$ that can be coded separately without increasing the entropy. To do so, one must code one of the two depending on the other, here $X_2$ depending on $X_1$. This can be extended to n bits of information in X. For example, for n=3:

$$H(X_1, X_2, X_3|Y) = H(X_1|Y)H(X_2|Y,X_1)H(X_3|Y,X_1,X_2)$$

It will be understood that as the occupancy pattern, i.e. bit sequence X, gets longer there are more conditions for coding later bits in the sequence. For a binary coder (e.g. CABAC) this means a large increase in the number of contexts to track and manage. Using an octree as an example, where the occupancy pattern is an eight-bit sequence $b=b_0 \ldots b_7$, the bit sequence may be split into the eight binary information bits $b_0 \ldots b_7$. The coding may use the neighbour configuration N (or NC) for determining context. Assuming that we can reduce the neighbour configurations to 10 effective neighbour configurations through grouping of neighbour configurations into classes of invariance, as described above, then N is an integer belonging to $\{0, 1, 2, \ldots, 9\}$. For shorthand, the "classes of invariant neighbour configurations" may be referred to herein, at times, simply as the "neighbour configurations", although it will be appreciated that this reduced number of neighbour configurations may be realized based on the class-based grouping of neighbour configurations based on invariance.

Figure 9:
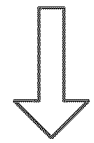
FIG. 9 illustrates the equivalence between non-binary coding and cascaded binary coding for an occupancy pattern.

FIG. 9 illustrates the splitting of an eight-bit pattern or sequence into eight individual bits for binary entropy coding. It will be noted that the first bit of the sequence is encoded based on the neighbour configuration, so there are ten total contexts available. The next bit of the sequence is encoded based on the neighbour configuration and any previously-encoded bits, i.e. bit $b_0$. This involves 20 total available contexts: obtained as the product of 10 from N and 2 from $b_0$. The final bit, $b_7$, is entropy encoded using a context selected from 1280 available contexts: obtained as the product of 10 from N and 128 from the partial pattern given by the previously-encoded bits $b_0, \ldots, b_6$. That is, for each bit the number of contexts (i.e. possible combinations of conditions/dependencies) is the product of the number of neighbour configurations defined (10, in this example, based on grouping of the 64 neighbour configurations into classes), and the number of partial patterns possible from the ordered sequence of n−1 previously-encoded bits (given by $2^{n-1}$).

As a result, there are a total of 2550 contexts to maintain in connection with binary coding of the occupancy pattern. This is an excessively large number of contexts to track, and the relative scarcity may cause poor performance because of context dilution, particularly for later bits in the sequence.

Accordingly, in some cases the encoders and decoders that determine whether the set of contexts can be reduced and, if so, apply a context reduction operation to realize a smaller set of available contexts for entropy coding at least part of an occupancy pattern using a binary coder. In at least some implementations, the context reduction is applied a priori to realize a reduced or smaller set of contexts that are then used by the encoder and decoder based on determining that the context reduction conditions are met. Those conditions may include determining that a neighbour configuration is empty or full, or that the bit being coded is at or above a particular position in the bit sequence, for example.

The context reduction operation reduces the number of available contexts in a set of available contexts to a smaller set containing fewer total contexts. It will be recalled, that the number of available contexts may depend, in part, on the bit position in the sequence, i.e. the index, since the context may depend on a partial pattern of previously-coded bits from the bit sequence. In some implementations, the number of contexts available in the set, before reduction, may be based on the number of neighbour configurations multiplied by the number of partial patterns possible with the previously-coded bits. For a bit at index i, where i ranges from 0 to n, the number of partial patterns may be given by $2^i$.

Example context reduction operations include reducing neighbour configurations for later bits in the bit sequence on the basis that previously-coded bits are associated with sub-volumes that screen or shield (e.g. are positioned in between) one of the neighbouring volumes, meaning the occupancy data provided by the previously-coded bits is more significant and relevant than the occupancy data associated with the shielded volume. Another example context reduction involves special handling of cases such as empty neighbour configurations or completely full neighbour configurations. Such situations may indicate a lack of directionality and, thus, less need to take into account the order of previously-coded bits associated with the sub-volumes. Finally, an example context reduction operation is applying a mapping of a set of contexts to a smaller set of contexts based on determining statistical similarities between pairs of contexts. The statistical similarities may be based on a distance metric between the pairs of contexts. Any such context reduction operations may be used individually or together in combination or sub-combination in some cases to reduce then number of contexts available for binary entropy coding at least some of the bits of an occupancy pattern.

Rate Distortion Optimization

Some applications for point cloud representation of three dimensional objects result in relatively dense point clouds. For example, some virtual or augmented reality applications feature dense point cloud data. As another example, some LiDAR applications, including some automotive applications, can produce dense point cloud data. This is particularly when the resolution of the scanner is somewhat fine, for example 1 cm, and objects in the environment are relatively large, for example more than 10 cm. In both of these applications, speed of transmission of point cloud data or long sequence storage can be of critical importance for effective application. Efficient and compact compression of point cloud data may be critical to achieving transmission speeds and storage capability that enable the applications to function as intended.

Dense point clouds that use an octree-based coding structure tend to result in an average of 4 occupied child nodes per node, i.e. half of all sub-volumes are occupied. It turns out that about 75% of the total bit rate dedicated to geometry representation is attributable to the last depth of the tree, i.e. signaling occupancy of the leaf nodes.

Accordingly, the present application proposes methods and devices that focus on introducing a small distortion to the data at the level of the furthest (from the root) leaves, i.e. the maximum depth leaves of the octree, if the resulting savings in bitrate is sufficiently significant.

Video coding has made use of intentional distortion through rate-distortion optimized quantization, where a quantized transform domain coefficient may have its magnitude increased or decreased (thus introducing distortion) if the impact on the coding rate sufficiently offsets the impact of the distortion, as measured by a Lagrangian cost expression. The same concept cannot be directly applied to point cloud coding because there is no transform operation and quantization operation in point cloud compression of geometric occupancy data, which is lossless.

Nevertheless, the present application describes methods and devices that introduce distortion at the furthest leaf-node level of an octree-structured point cloud through adding or removing one or more points, i.e. changing the occupancy status of one or more sub-volumes at the maximum depth of the octree. The present application is not, however, limited to implementations that use an octree-structure as other embodiments may use any tree-based structure.

Figure 10:
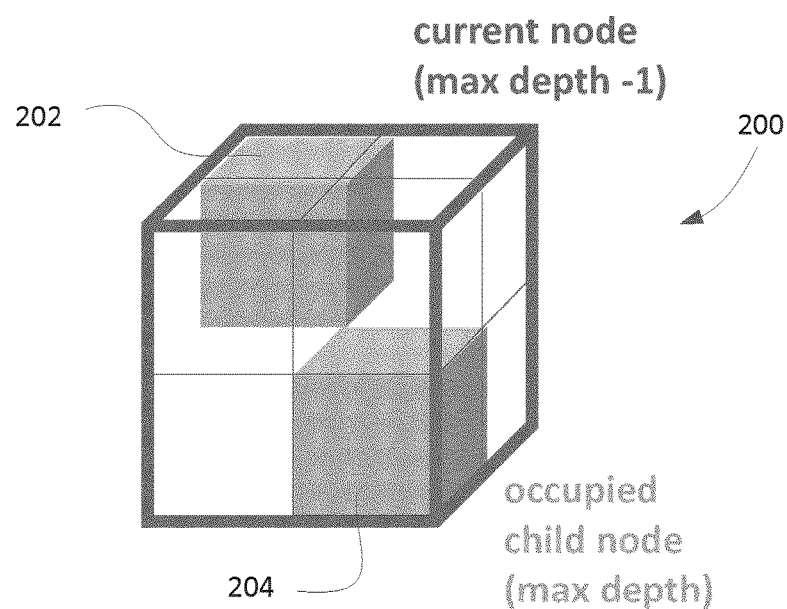
FIG. 10 illustrates a sub-volume divided into eight child sub-volumes.

Reference is now made to FIG. 10, which shows an example parent sub-volume 200. The parent sub-volume is partitioned into eight child sub-volumes. Two of the eight child sub-volumes are occupied and are labelled 202 and 204. The parent sub-volume 200 is at tree depth "max depth −1", and the child sub-volumes are at tree depth "max depth". The words "node" and "sub-volume" may be used interchangeably herein.

It will be appreciated that the coding of occupancy data for a point cloud is lossless. The tree-based coding signals geometric location of points of the point cloud through occupancy bits in the tree structure. While context adaptive entropy coding may be used to compress the occupancy data, there is no spectral transform applied to try to compress the data by converting it to a transform domain. Moreover, the occupancy data is binary so there is no quantization possible.

Figure 11:
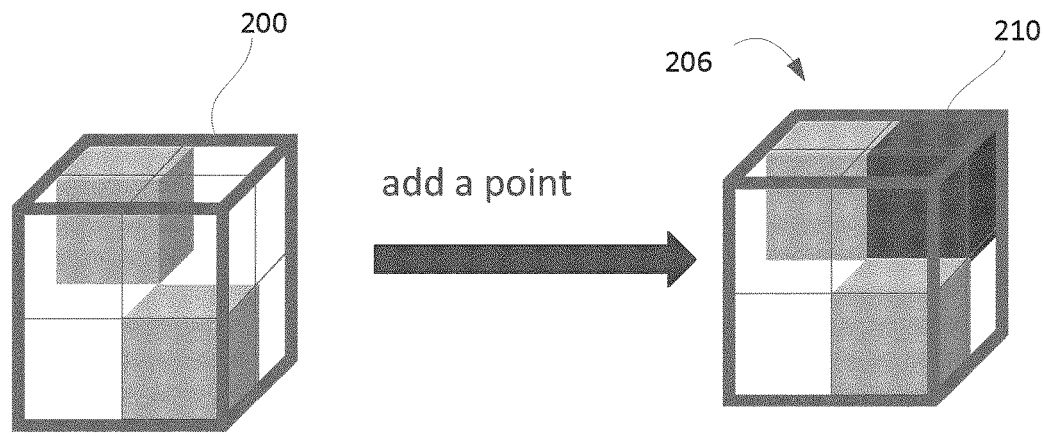
FIG. 11 shows the adding or removing of a point from an occupied sub-volume.
Figure 11:
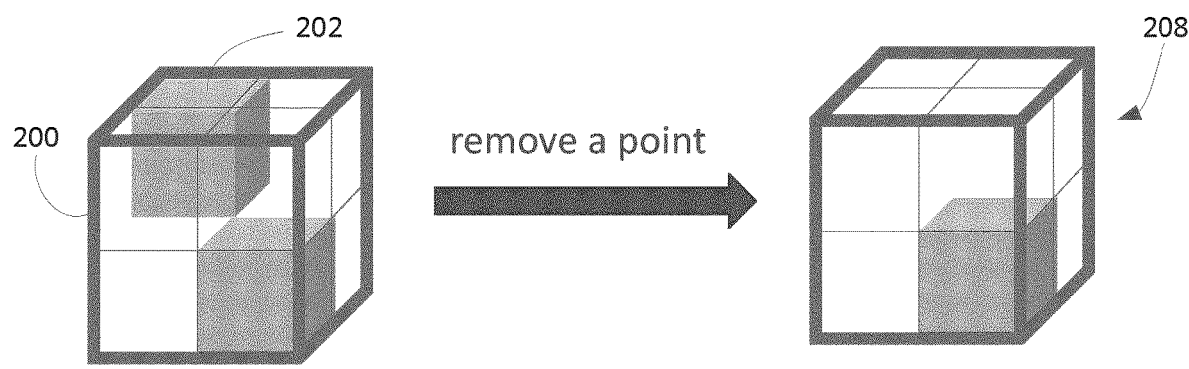

In order to introduce lossy coding to achieve compression gains, operations are to be performed directly on the raw positional occupancy data. In particular, at the maximum depth level, i.e. furthest leaf nodes, a point may be added to the point cloud, or a point may be removed from the point cloud (or both, which is effectively "moving" a point). Reference is made to FIG. 11, which shows the parent sub-volume 200 under two scenarios. In one case, the parent sub-volume 200 is modified by adding a point, as indicated by the new occupied child sub-volume 210. This results in a modified parent sub-volume 206 having a different 8-bit occupancy pattern than the original parent sub-volume 200. Effectively, the occupancy bit corresponding to child sub-volume 210 has been inverted from a 0 to a 1 to indicate that it is now occupied by a point.

In the other scenario depicted, the parent sub-volume 200 is modified by removing a point. In particular, the point within child sub-volume 202 is removed, resulting in a modified parent sub-volume 208 having a different 8-bit occupancy pattern than the original parent sub-volume. Effectively, the occupancy bit associated with child sub-volume 202 has been inverted from a 1 to a 0 to indicate that it is now unoccupied.

In either of the two above scenarios, distortion is introduced because the modified parent sub-volumes 206, 208 that are to be coded and sent to the decoder will result in a decoded point cloud that either has an extra point that was not in the original point cloud, or is missing a point that was in the original point cloud. The difference between the modified point cloud and the original point cloud is a distortion change ΔD and is capable of being quantified. Measurements for distortion of point clouds are discussed further below.

The modification of the occupancy pattern for the parent sub-volume 200 has an impact on the coding rate because the pattern is now different. It is still 8 bits long, but the arithmetic context-adaptive coding of the 8-bit sequence may be more costly or less costly in terms of the bitrate. By determining the ΔR—the change in bitrate—it is possible to determine the cost savings or cost increase of making the change.

If the change in distortion and the changing in bitrate are quantifiable, then it can be determined whether the change is advantageous or not through use of a Lagrange cost expression. Such an expression takes the form:

$$\Delta C = \Delta D + \lambda \Delta R$$

where ΔC is the change in "cost" so quantified, and λ is the Lagrange parameter selected to balance the relative impact of changing distortion versus changing bitrate. The change in distortion, ΔD, is a positive contribution to cost in that distortion has increased. The aim is to identify changes for which the bitrate savings more than offset the increased distortion, resulting in a negative change in cost. The objective is to minimize the change in cost ΔC.

This operation is termed Rate Distortion Optimization (RDO). In this case, because the distortion mechanism is the adding or removing of points in a point cloud, the operation may be termed Rate Distortion Optimized Removing and Adding of Points (RDORAP).

Given an original point cloud as the set of points A and a modified point cloud as the set of points B, one measure of distortion is to identify the distance between points in A and B. In the general case, the distance d of A relative to B may be expressed as:

$$d(A, B) = \frac{1}{\#A} \sum_{a \in A} \min_{b \in B} \|a - b\|_2$$

where $\|\cdot\|_2$ stands for the L2 norm, #A is the count of points in A, a is a point in set A and b is a point in set B. The expression involves, for every point a in A, finding the closest point b in B, and quantifying the distance between that point a and its closest point b. The sum of those distances is then average over the count of points, #A, in set A. It will be appreciated that in most instances the points in A match the points in B.

This measure of distance is taken in two directions—d(A,B) and d(B,A)—to account for both points removed from B and points added to B. The measure of distortion may then be expressed as:

$$D(A,B) = \max(d(A,B), d(B,A)), \text{ or}$$

$$D(A,B) = d(A,B) + d(B,A).$$

The above metric for distortion is not the only possible measure of distortion between A and B. As an illustrative example, it may be possible to quantify the disparity from A to B using an L1 norm in an expression such as:

$$d(A, B) = \sum_{a \in A} \log_2\left(1 + \min_{b \in B} \|a - b\|_1\right)$$

where $\|\cdot\|_1$ stands for the L1 norm. The present application is not limited to a specific norm or expression to compute the distance or quantify distortion. The use of the base-2 logarithm (and the constant 1 in the log expression) may not be used in some cases.

In some other implementations, the distortion metric may include other measures. For example, a logarithm other than a base-2 logarithm may be used in some cases. Instead of a logarithm, a power function may be used, such as $x^p$, where p is less than 1, such as a square root. Any selected non-linear function should evaluate to zero when the set A matches the set B, since a perfect match implies zero distortion.

From the above expressions, it will be appreciated that the distortion between point clouds A and B will evaluate to zero unless a point is added to or removed from A to form B, i.e. unless the two sets A and B are unequal. In that case, the distortion is entirely determined by the distance from the new point in B to its closest neighbouring point in A, or by the distance from the removed point in A to its closest neighbour in B. The fact that the distortion measurement implicates a closest neighbouring point means that the sub-volumes neighbouring the parent sub-volume may be relevant in the distortion assessment, since the closest point may be located in an adjacent sub-volume rather than in the parent sub-volume.

As noted above, occupancy information is coded into the bitstream using an entropy coder, for instance a binary entropy coder that encodes child node occupancy bits $b_i$ one by one. Practically, adding a point is equivalent to flipping (inverting) a bit $b_i$ from 0 to 1, and removing a point is equivalent to flipping a bit $b_i$ from 1 to 0.

In the case of a point cloud with attributes (e.g. colour, reflectance, or other characteristics), the value of attributes attached to newly-added point may be obtained by interpolation from the nearest original points. Those attributes are then coded as per usual, meaning the cost of adding a new point is not just the change in cost for coding the flipped bit, but also the cost of coding the additional attributes. In other words, the rate change $\Delta R$ in the cost function may include the change in bitrate due to adding/removing a point, i.e. inverting an occupancy bit, and the change in bitrate due to either coding additional attributes for an added point, or not coding attributes for a removed point. For at least this reason, the proposed technique tends to not result in adding to the number of points. As will be discussed below, the implementation of the Lagrange cost assessment may be over all possible changes within a sub-volume (or even across multiple sub-volumes), in which case a point added and a point removed result in no additional attributes being coded. If the implementation is a bit-by-bit greedy approach to Lagrange cost assessment, then points may not be added very often due to the cost impact of additional attributes (assuming the coding of those attributes is reflected in the cost expression).

In the case of a point cloud without attributes (or attributes are not taken into account in the Lagrange cost), it has been observed that the proposed technique does not tend to change significantly the number of coded points, relative to the number of points of the original point cloud. It appears that, statistically, the number of removed points and the number of added points balance each other.

In a simplified implementation, the bitrate R may be determined as the number of bits needed by the entropy coder to code the occupancy information of the current node, made of the eight bits $b_i$ associated with the eight child nodes. Flipping a bit $b_i$ of occupancy information may lead to a bitrate change $\Delta R$ that is the rate difference between coding the original occupancy pattern and the modified occupancy pattern with the flipped occupancy bit.

Figure 12:
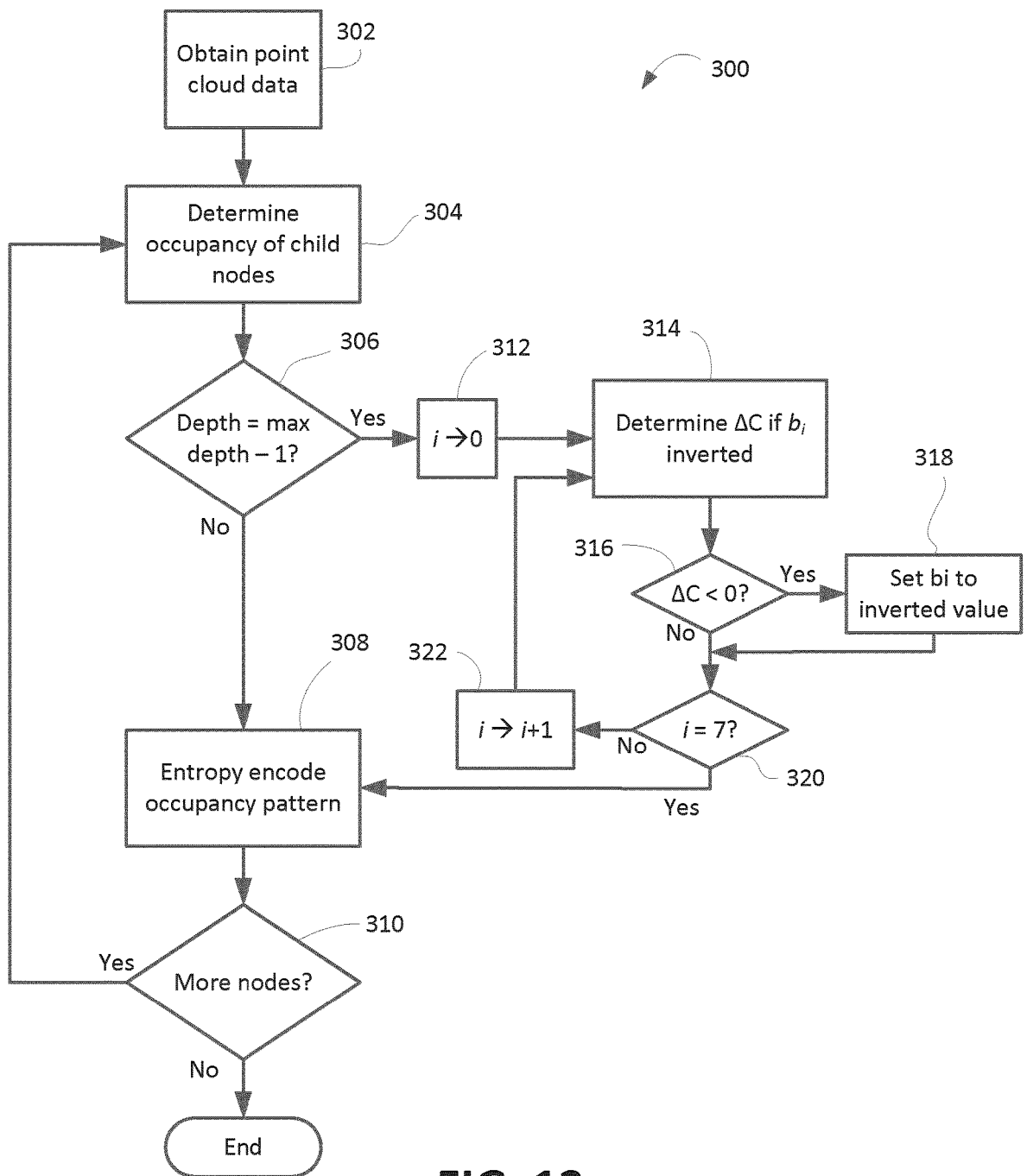
FIG. 12 shows flowchart illustrating an example method of encoding a point cloud.

Reference is now made to FIG. 12, which shows a flowchart of an example method 300 for lossy encoding of point cloud data. The method 300 begins with the encoder obtaining point cloud data in operation 302. As noted above, in some cases the point cloud data may only include the points of the cloud, i.e. positional point data, that represents or models objects in a three-dimensional volume. In some cases, the points may have associated attributes in addition to their location, but for simplicity of explanation the discussion of the example method 300 considers only the coding of the points as locations. The coding in this example case is tree-based coding of occupancy data representing whether there is at least one point in the sub-volume associated with a node of the tree. In particular, this example reflects octree-based coding.

In operation 304, the encoder determines, for a current node, the occupancy of its eight child nodes. An occupancy bit, $b_i$, signals whether the i-th child sub-volume is occupied. The encoder then, in operation 306, determines whether the depth of the tree is max-depth-1, i.e. whether the current node is at depth max-depth-1. In other words, it determines whether the child nodes for which it has just determined occupancy are the furthest leaf nodes (max depth) of the tree. If not, then it proceeds to entropy encode the occupancy data as per usual, as indicated by operation 308.

If, however, the current node is at max-depth-1, then the encoder engages in an RDORAP process. In particular, the encoder sets a child index i to 0 in operation 312, and in operation 314 it then determines the change in rate distortion cost if bit $b_i$ were to be inverted. As described above, operation 314 involves measuring the distortion that results from flipping the bit, which may involve one of the metrics described above. It also involves determining the rate cost associated with coding the bit $b_i$ accurately and the rate cost of coding the bit if it were to be inverted, and then comparing them to determine the resulting change in bitrate. A Lagrangian expression is then used to determine the resulting change in cost.

As discussed above, the rate cost may take into account the overall rate cost of coding the sequence of eight occupancy bits, i.e. the occupancy pattern. By assessing the rate cost of the whole pattern, the rate cost assessment takes into account the cost of coding all the bits in the pattern, since the cost of coding the bits following the inverted bit may be affected by the change in the inverted bit. In a simplified implementation, only the cost of coding the inverted bit is included in the rate cost.

In operation 316, the encoder assesses whether the change in cost is advantageous, i.e. whether flipping bit $b_i$ results in a change in cost, $\Delta C$, less than zero. If so, then in operation 318 the encoder flips bit $b_i$. If not, then the original bit $b_i$ is retained.

The RDORAP process in this example is a greedy algorithm that assesses each bit in the sequence of occupancy bits in turn. In this example, based on an octree-structure, there are eight bits to each occupancy sequence or pattern for a current node since it has eight child nodes. Accordingly, operations 320 and 322 reflect the increment of the child index i and the assessment of whether all eight have been tested. It will be appreciated that the occupancy bits are tested in a coding order for the child sub-volumes within. That is, the order in which they appear in the occupancy pattern is the order in which the entropy encoder will encode them, and this is the order in which they are tested in the RDORAP process.

Once the RDORAP process is completed, the occupancy pattern is then encoded in operation 308, whether not any bits were altered in by RDORAP. The encoder continues to code occupancy data in this manner until all nodes of the tree-structured coding of the point cloud have been entropy encoded, as indicated by operation 310. The entropy encoding may be context-adaptive entropy encoding.

It will be appreciated that the described process 300 uses a greedy algorithm for RDORAP. In some other implementations, more than one bit may be assessed at a time. For example, in some implementations the whole eight bit occupancy pattern for a current node may be evaluated for potential changes at the same time. This may include testing all possible combinations of eight bits, i.e. 256 possible sequences, to identify the least cost sequence from a rate-distortion optimization point-of-view.

The process 300 described is simplified and does not show all operations that occur in the course of encoding point cloud data. As an example, the encoding process may include prediction operations, which may result in coding of residual data rather than occupancy data, or which may be used to improve context selection. Predictors, if accurate, tend to increase the absolute magnitude of $\Delta R$ because the predicted value of the bit $b_i$ has much lower entropy than its flipped value. Also, very lossy configurations using a high Lagrange parameter ($\lambda \gg 1$) tend to simply minimize the bitrate, while accepting significant distortion. In an implementation that uses prediction, such an encoder may tend to follow the predictor occupancy blindly.

Testing of an example implementation of the RDORAP process on an MPEG-approved test point cloud entitled "longdress" has shown the possibility of 10-25% improvement in compression performance, depending on the bitrate targeted. When combined with some inter-prediction techniques, gains of up to 65% in compression performance have been observed.

Figure 13:
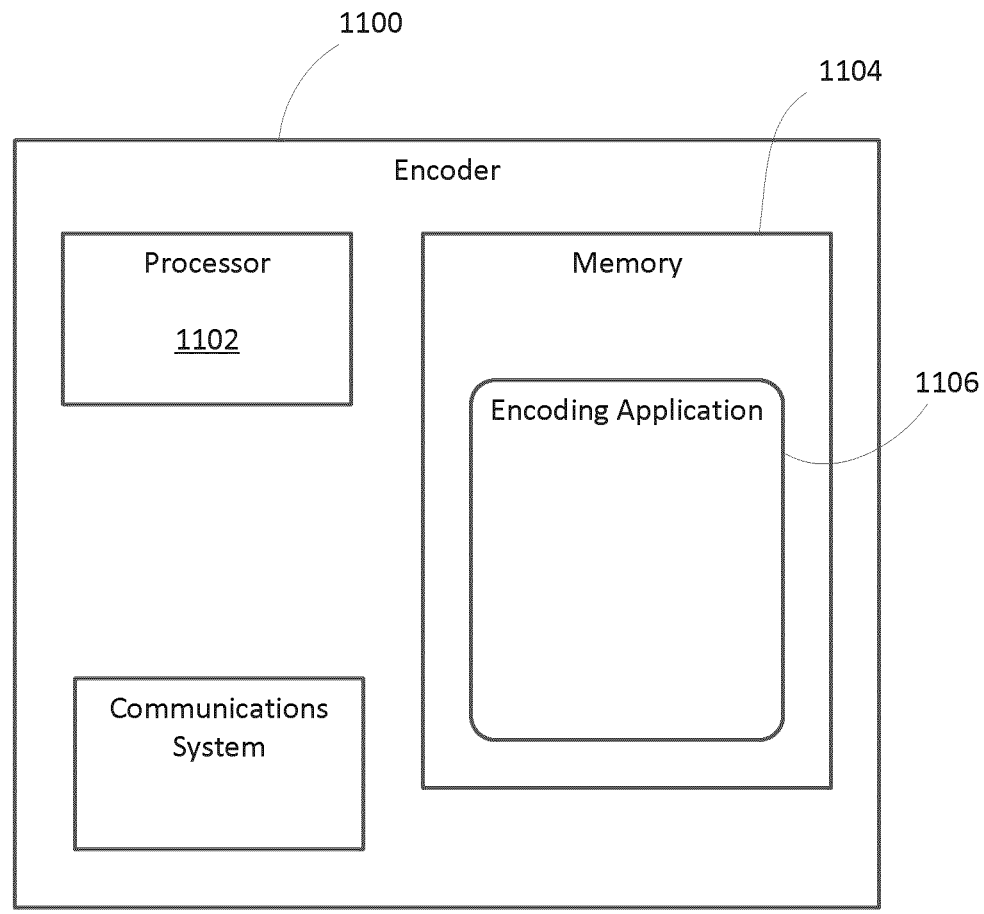
FIG. 13 shows an example simplified block diagram of an encoder.

Reference is now made to FIG. 13, which shows a simplified block diagram of an example embodiment of an encoder 1100. The encoder 1100 includes a processor 1102, memory 1104, and an encoding application 1106. The encoding application 1106 may include a computer program or application stored in memory 1104 and containing instructions that, when executed, cause the processor 1102 to perform operations such as those described herein. For example, the encoding application 1106 may encode and output bitstreams encoded in accordance with the processes described herein. It will be understood that the encoding application 1106 may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 14:
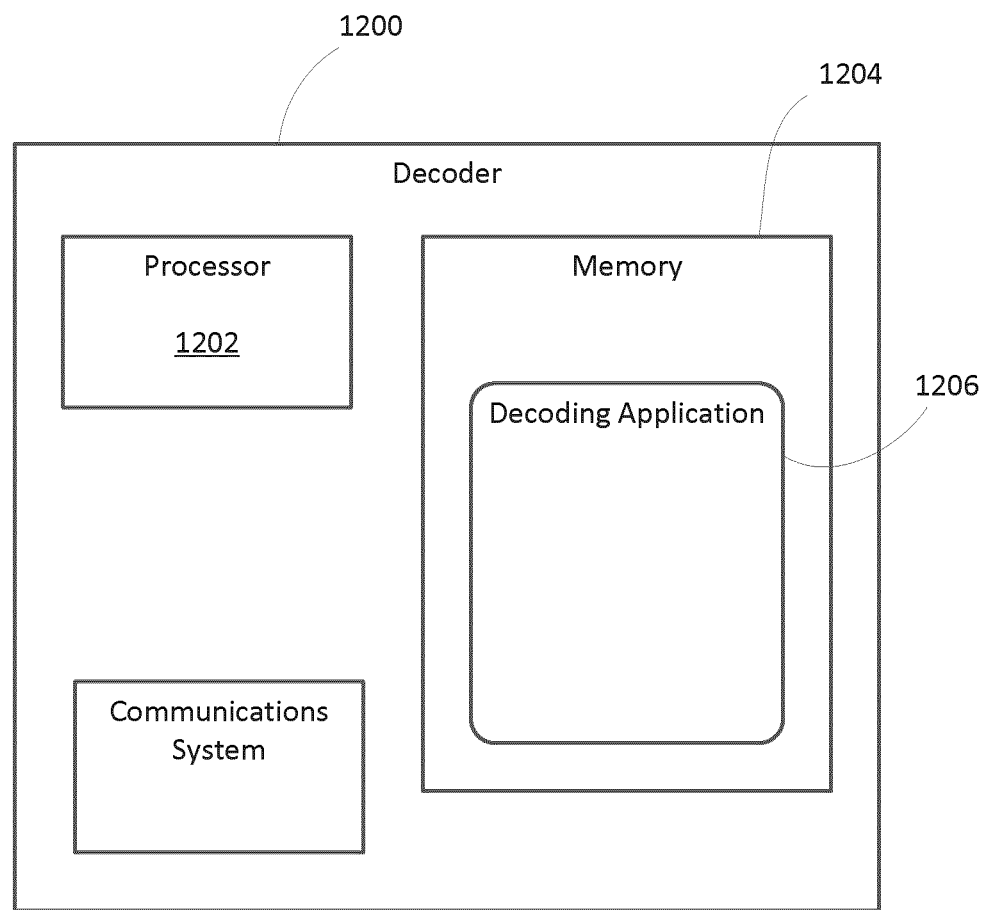
FIG. 14 shows an example simplified block diagram of a decoder.

Reference is now also made to FIG. 14, which shows a simplified block diagram of an example embodiment of a decoder 1200. The decoder 1200 includes a processor 1202, a memory 1204, and a decoding application 1206. The decoding application 1206 may include a computer program or application stored in memory 1204 and containing instructions that, when executed, cause the processor 1202 to perform operations such as those described herein. It will be understood that the decoding application 1206 may be stored on a computer-readable medium, such as a compact disc, flash memory device, random access memory, hard drive, etc. When the instructions are executed, the processor 1202 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Certain adaptations and modifications of the described embodiments can be made. Therefore, the above discussed embodiments are considered to be illustrative and not restrictive.

What is claimed is:

1. A method of lossy encoding a point cloud to generate a bitstream of compressed point cloud data representing the three-dimensional location of a physical object, the point cloud being located within a volumetric space recursively split into sub-volumes and containing the points of the point cloud, each of the points having a geometric location within the volumetric space, wherein an occupancy bit associated with each respective sub-volume indicates whether that respective sub-volume contains at least one of the points, the recursive splitting occurring to a maximum depth, the method comprising:

for an occupied sub-volume at a depth one level above the maximum depth,
determining a rate-distortion cost of inverting at least one of the occupancy bits associated with child sub-volumes of the occupied sub-volume, wherein determining the rate-distortion cost includes determining a change in bitrate attributable to inverting the at least one of the occupancy bits;

when the rate-distortion cost is negative, then inverting the at least one of the occupancy bits, and, when the rate distortion cost is not negative, then not inverting the at least one of the occupancy bits; and entropy encoding the occupancy bits associated with the child sub-volumes to output a bitstream of compressed encoded point cloud data.

2. The method claimed in claim 1, wherein inverting the at least one of the occupancy bits includes adding a point to the point cloud if one of the occupancy bits is inverted from a 0 to a 1.

3. The method claimed in claim 1, wherein inverting the at least one of the occupancy bits includes removing a point from the point cloud if one of the occupancy bits is inverted from a 1 to a 0.

4. The method claimed in claim 1, wherein determining the rate-distortion cost includes determining the rate-distortion cost for each occupancy bit in turn, and, for each occupancy bit, if the rate-distortion cost of inverting that occupancy bit is negative then inverting that occupancy bit.

5. The method claimed in claim 4, wherein the determining the rate-distortion cost for each occupancy bit in turn occurs in a coding order within the occupied sub-volume.

6. The method claimed in claim 1, wherein determining the rate-distortion cost includes determining the rate-distortion cost of all possible sequences of the occupancy bits to identify a least cost sequence, and wherein entropy encoding includes entropy encoding the least cost sequence.

7. The method claimed in claim 1, wherein determining the rate-distortion cost further includes determining a distortion metric quantifying distortion attributable to inverting the at least one of the occupancy bits.

8. The method claimed in claim 7, wherein the distortion metric includes determining a distance between a point represented by the occupancy bit and a nearest point in the point cloud.

9. The method claimed in claim 8, wherein the nearest point is a point in one of the child sub-volumes within the occupied sub-volume, or within a child sub-volume in a neighbouring sub-volume adjacent to the occupied sub-volume.

10. The method claimed in claim 7, wherein the distortion metric is $D(A,B)=d(A,B)+d(B,A)$, in which A is a set representing the points of the point cloud and B is a set representing the points of the point cloud after inverting the at least one of the associated occupancy bits, and wherein d( ) is a measure of distance.

11. The method claimed in claim 1, further comprising first determining that the occupied sub-volume is at the depth one level above the maximum depth a tree-based structure.

12. The method claimed in claim 1, wherein entropy encoding comprises context-adaptive arithmetic coding.

13. An encoder for encoding a point cloud to generate a bitstream of compressed point cloud data, the point cloud being located within a volumetric space recursively split into sub-volumes and containing the points of the point cloud, each of the points having a geometric location within the volumetric space, wherein an occupancy bit associated with each respective sub-volume indicates whether that respective sub-volume contains at least one of the points, the recursive splitting occurring to a maximum depth, the encoder comprising:

a processor;
memory; and
an encoding application containing instructions executable by the processor that, when executed, cause the processor to:
for an occupied sub-volume at a depth one level above the maximum depth,
determine a rate-distortion cost of inverting at least one of the occupancy bits associated with child sub-volumes of the occupied sub-volume, wherein determining the rate-distortion cost includes determining a change in bitrate attributable to inverting the at least one of the occupancy bits;
when the rate-distortion cost is negative, invert the at least one of the occupancy bits, and, when the rate distortion cost is not negative, then not invert the at least one of the occupancy bits; and
entropy encode the occupancy bits associated with the child sub-volumes to output a bitstream of compressed encoded point cloud data.

14. A non-transitory processor-readable medium storing processor-executable instructions for encoding a point cloud to generate a bitstream of compressed point cloud data representing the three-dimensional location of a physical object, the point cloud being located within a volumetric space recursively split into sub-volumes and containing the points of the point cloud, each of the points having a geometric location within the volumetric space, wherein an occupancy bit associated with each respective sub-volume indicates whether that respective sub-volume contains at least one of the points, the recursive splitting occurring to a maximum depth wherein the instructions, when executed by a processor, cause the processor to:
for an occupied sub-volume at a depth one level above the maximum depth,
determine a rate-distortion cost of inverting at least one of the occupancy bits associated with child sub-volumes of the occupied sub-volume, wherein determining the rate-distortion cost includes determining a change in bitrate attributable to inverting the at least one of the occupancy bits;
when the rate-distortion cost is negative, invert the at least one of the occupancy bits, and, when the rate distortion cost is not negative, then not invert the at least one of the occupancy bits; and
entropy encode the occupancy bits associated with the child sub-volumes to output a bitstream of compressed encoded point cloud data.

15. The encoder claimed in claim 13, wherein the instructions, when executed, are to invert the at least one of the occupancy bits by adding a point to the point cloud if one of the occupancy bits is inverted from a 0 to a 1.

16. The encoder claimed in claim 13, wherein the instructions, when executed, are to invert the at least one of the occupancy bits by removing a point from the point cloud if one of the occupancy bits is inverted from a 1 to a 0.

17. The encoder claimed in claim 13, wherein the instructions, when executed, are to determine the rate-distortion cost by determining the rate-distortion cost for each occupancy bit in turn, and, for each occupancy bit, if the rate-distortion cost of inverting that occupancy bit is negative then invert that occupancy bit.

18. The encoder claimed in claim 17, wherein the determining the rate-distortion cost for each occupancy bit in turn occurs in a coding order within the occupied sub-volume.

19. The encoder claimed in claim 13, wherein the instructions, when executed, are to determine the rate-distortion cost by determining the rate-distortion cost of all possible sequences of the occupancy bits to identify a least cost sequence, and wherein the instructions, when executed, are to entropy encode by entropy encoding the least cost sequence.

20. The encoder claimed in claim 13, wherein the instructions, when executed, are to determine the rate-distortion cost by further determining a distortion metric quantifying distortion attributable to inverting the at least one of the occupancy bits.

21. The encoder claimed in claim 20, wherein determining the distortion metric includes determining a distance between a point represented by the occupancy bit and a nearest point in the point cloud.

22. The encoder claimed in claim 21, wherein the nearest point is a point in one of the child sub-volumes within the occupied sub-volume, or within a child sub-volume in a neighbouring sub-volume adjacent to the occupied sub-volume.

23. The encoder claimed in claim 20, wherein the distortion metric is $D(A,B)=d(A,B)+d(B,A)$, in which A is a set representing the points of the point cloud and B is a set representing the points of the point cloud after inverting the at least one of the associated occupancy bits, and wherein d( ) is a measure of distance.

24. The encoder claimed in claim 13, wherein the instructions, when executed, are to further first determine that the occupied sub-volume is at the depth one level above the maximum depth a tree-based structure.

25. The encoder claimed in claim 13, wherein entropy encoding comprises context-adaptive arithmetic coding.

* * * * *